(12) United States Patent
Gruss et al.

(10) Patent No.: US 7,425,396 B2
(45) Date of Patent: Sep. 16, 2008

(54) METHOD FOR REDUCING AN OVERLAY ERROR AND MEASUREMENT MARK FOR CARRYING OUT THE SAME

(75) Inventors: Stefan Gruss, Dresden (DE); Detlef Hofmann, Dresden (DE); Rainer Pforr, Weixdorf (DE); Mario Hennig, Dresden (DE); Guido Thielscher, Dresden (DE); Hans-Georg Froehlich, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 810 days.

(21) Appl. No.: 10/952,885

(22) Filed: Sep. 30, 2004

(65) Prior Publication Data

US 2005/0069790 A1    Mar. 31, 2005

(30) Foreign Application Priority Data

Sep. 30, 2003  (DE) ............................... 103 45 463
Dec. 17, 2003  (DE) ............................... 103 59 200

(51) Int. Cl.
*G03C 5/00* (2006.01)
*G03F 9/00* (2006.01)

(52) U.S. Cl. ........................... 430/22; 430/30; 430/296; 430/942

(58) Field of Classification Search ................... 430/22, 430/30, 296, 942
See application file for complete search history.

(56) References Cited

U.S. PATENT DOCUMENTS

| 5,701,013 A | 12/1997 | Hsia et al. |
| 5,757,507 A | 5/1998 | Ausschnitt et al. |
| 6,462,818 B1 | 10/2002 | Bareket |
| 2001/0055720 A1 | 12/2001 | Sato et al. |
| 2002/0182516 A1 | 12/2002 | Bowes |

*Primary Examiner*—Christopher G Young
(74) *Attorney, Agent, or Firm*—Edell, Shapiro & Finnan, LLC

(57) ABSTRACT

A method for reducing an overlay error of structures of a layer to be patterned relative to those of a reference layer includes formation of standard measurement marks assigned to one another in the two layers for determining an overlay error and for setting up further measurement marks for determining an additional optical imaging error of the projection system at least in the current layer. The further measurement marks have a geometry adapted to the geometry of selected structures of the circuit patterns to be transferred by projection from masks onto semiconductor substrates. An imaging error affects circuit structures and further measurement marks in the same way. An alignment correction for a subsequent exposure can be calculated from the measured positional deviations between the two standard measurement marks and between the standard measurement mark and the further measurement mark of the layer currently to be patterned.

12 Claims, 16 Drawing Sheets

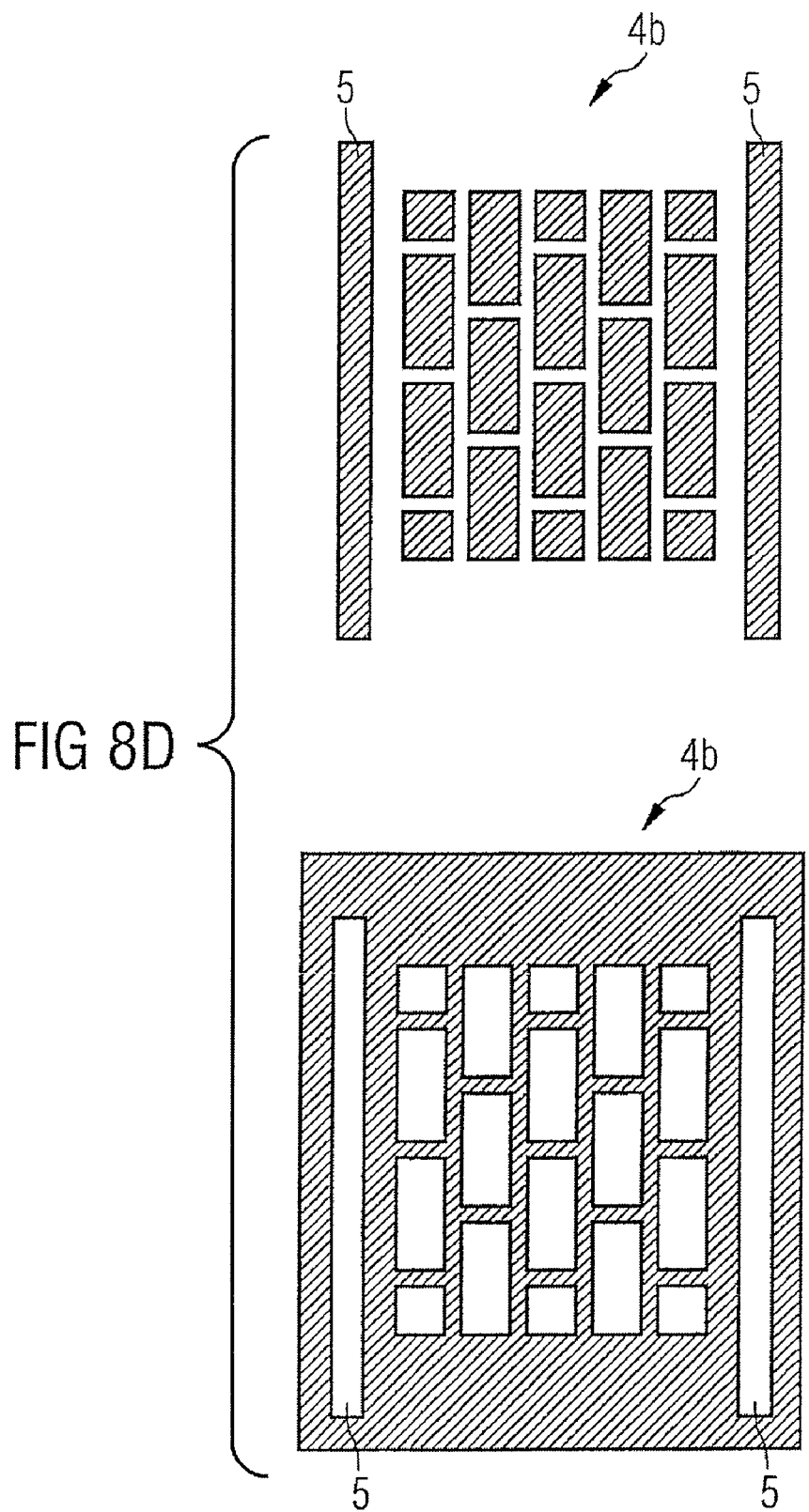

→ OL-Fehler an Meßstruktur

--→ OL-Fehler an Schaltkreisstruktur gemessen

METHOD FOR REDUCING AN OVERLAY ERROR AND MEASUREMENT MARK FOR CARRYING OUT THE SAME

CROSS REFERENCE TO RELATED APPLICATIONS

This application claims priority under 35 USC §119 to German Application No. DE 10345463.2, filed on Sep. 30, 2003, and titled "Method for Reducing an Overlay Error and Measurement Mark for Carrying out the Same" and German Application No. DE 10359200.8, filed on Dec. 17, 2003, and titled "Method for Reducing an Overlay Error and Measurement Mark for Carrying out the Same," the entire contents of each are hereby incorporated by reference.

FIELD OF THE INVENTION

The invention relates to a method for detecting and for reducing an overlay error of a circuit structure of a circuit pattern during the transfer from a photolithographic mask into a layer applied on a semiconductor wafer, in particular, a photoresist layer, to a measurement mark for determining the overlay error between circuit structures that are patterned photolithographically in different planes above a semiconductor substrate, and to an arrangement of such measurement marks on a photo mask.

BACKGROUND

In order to realize even smaller feature sizes in semiconductor technology, techniques for increasing the resolution, i.e., resolution enhancement techniques, RET, are increasingly being used. In this case, primarily innovative mask techniques are used besides structure-specific illumination methods. Alternating phase masks, in particular, have a high lithographic potential, so that it is therefore expected that they will be used to an increased extent in the future.

One problem associated with the novel lithographic methods is based on the fact that the optics of modern lithographic projection systems have non-negligible aberrations despite their high imaging performance. Aberrations are, for example, a consequence of minimal surface inaccuracies of individual lenses in the projection systems used for the transfer, or tiny misalignments of the lenses in relation to one another and also extremely small lens tilting errors relative to the optical axis. This has the effect that semiconductor structures in the vicinity of the limiting resolution, i.e., with a period of at most $0.8*\lambda/NA$, where $\lambda$ is the wavelength of the light used for the exposure and NA is the numerical aperture of the objective used for the exposure, suffer a positional deviation from a desired position which differs significantly from the positional deviation of the customary overlay error measurement structures, caused by reason, e.g., of inaccuracies during the alignment of semiconductor substrates during the progressive exposure process. The deviation, as determined by overlay measuring devices, of a standard measurement mark generally used for determining the overlay error from the desired position, does not reproduce the actual positional deviation of the circuit structures to be transferred.

Calculation of corrections for the alignment is beset by errors. This in turn has the effect that although after the required corrections have been carried out, the standard measurement marks have small deviations from the desired position and thus satisfy the desired specifications, the circuit structures that are actually of interest are subject to a significant overlay error. This in turn leads to effective losses of yield and to higher costs for component manufacture.

Marks for determining the mutual overlay error of structures of two patterned layers are generally also referred to as overlaying measurement marks.

For example, FIG. 9 shows a detail from an alternating phase mask for patterning holes for making contact with gates in a process for fabricating DRAM (dynamic random access memory) cell arrays. In comparison with conventional halftone phase masks, such a mask enables a significant improvement in the process window and consequently a better structure resolution.

FIGS. 1A and 1B show a customarily used grouping of standard measurement marks respectively in dark and bright field versions. These conventional standard measurement marks have four outer rectangular bars, arranged along the periphery of an imaginary first square, for a first lithographic plane or mask and also four further inner rectangular bars, arranged along the periphery of an imaginary second square, which is arranged concentrically with and parallel to the first square, for the subsequent photolithographic plane or mask, for example, the gate contact-making plane shown in FIG. 9. The outer bars typically have a width of 1.5 µm, while the inner bars have a width of 0.75 µm. In this case, the assignment of the bars to a lithographic plane may also be interchanged, of course.

Usually, the standard measurement marks are arranged at predetermined image field points, typically for each image field at the four corner points and in the center, in the sawing kerf between adjacent chips and are removed after singulation of the wafer with the sawing kerf.

FIG. 10 shows 8 circuit patterns of DRAM chips as are shown as a detail in FIG. 9. The circuit patterns are projected into the image field from a mask. The chips (white areas) are separated by sawing kerfs illustrated by the lines in FIG. 9. The length of the vectors illustrated in FIG. 10 specify the overlay error in the image field, which was measured at the standard measurement marks as shown in FIG. 1, and at the circuit structures, as shown in FIG. 9 in the image field. The large difference, particularly in the upper image field region, is clearly evident. The deviation between the overlay error measured at the standard measurement marks and the actual overlay error of the circuit structure is thus also dependent on the measurement position in the image field. The overlay errors determined at standard measurement marks with the available overlay measuring devices thus describe extremely inaccurately the error that occurs in the component. As a consequence, this error is not detected and corrected accurately enough.

When using special illumination methods, the problem additionally arises that the positional deviation from the desired position depends on the illumination mode. A different positional deviation on the semiconductor substrate is established depending on whether, for example, annular illumination, dipole illumination, or quadrupole illumination is used.

A known test structure arrangement for determining an overlay error, for example, has two grating patterns rotated through 90° with respect to one another. One grating is provided for measurement with respect to the x direction and the other for measurement with respect to the y direction. Thus, x and y standard measurement marks are different from one another and, consequently, also have Fourier spectra that deviate from one another. In the case of the grating structures, spacing and line width are identical and correspond to the minimum line width on the semiconductor substrate. One part of each grating pattern is arranged in a first layer and the other part is arranged in a second layer. The orientation of the other part is measured with respect to the first layer. In order to determine the overlay error, the grating structure is resolved by the measuring system.

A method for detecting and for reducing an overlay error between circuit structures of different lithographic planes is desirable. In particular, an increase in the yield of component fabrication and a reduction in the costs along with reducing the influence of optical imaging errors on the alignment of semiconductor substrates during lithographic projection is desirable.

SUMMARY

A method for reducing an overlay error between structures of two photolithographic planes during the transfer of a respective circuit pattern envisions that, in comparison with conventional methods, the positional deviation between the customary standard measurement marks and rather the positional deviation or shift between a standard measurement mark and a further measurement mark, which, during the transfer from the mask into the photoresist layer, experiences a similar lateral shift to the circuit structure of interest, are determined and compared with the shift of the standard measurement mark, and a correction for the alignment is calculated from both.

When the circuit pattern is transferred into the photoresist layer, due to its fine circuit structures and, under certain circumstances, associated optical imaging errors, the circuit pattern may suffer a different positional deviation from the desired position than a standard measurement mark that is not subpatterned any further. As a result, the method according to the invention enables the overlay error to be detected relatively more accurately than previously possible. In particular, the influence of shortcomings of the individual lens system on the imaging result can be taken into account relatively more accurately.

The method also includes, for instance, determining the shift of circuit structures in an underlying reference layer by measuring the positional deviation between a standard measurement mark and a second further measurement mark likewise transferred into the reference layer. The latter has a geometry such that it experiences the same shift as the circuit structure transferred into the reference layer during the transfer in the projection system. The reference layer is applied on the semiconductor substrate below, e.g., the current photoresist layer.

The method according to the invention may also include determining and storing an overlay error between the standard measurement mark in the reference layer and the standard measurement mark in the photoresist layer for the predetermined image field points.

If the circuit pattern to be transferred includes a plurality of overlay-critical widths, i.e., widths near the resolution limit of the projection system, of circuit structures, then the method described above is carried out in accordance with a further refinement for each overlay-critical circuit structure with a corresponding further measurement mark having a geometry adapted to the circuit structure. Afterward, a weighted average value of the actual overlay error is determined.

The method during which the actual overlay error is determined, for instance, is carried out again after the correction has been carried out, in order to ascertain whether the correction was successful.

A further measurement mark for determining an overlay error of structures of two photolithographic planes during the transfer of a respective circuit pattern by photo masks onto a semiconductor substrate in a projection system for fabricating integrated components, which has a microstructure with a geometry such that, during the transfer, experiences the same lateral shift as one of the structures of a circuit pattern transferred into the further layer together with the measurement mark.

Adaptation of the geometry of further measurement marks to the circuit structures based on a comparison of the two Fourier spectra corresponds to local intensity maxima within the Fourier spectrum of the further measurement mark for the plurality of local intensity maxima within the Fourier spectrum of selected structures of the circuit pattern.

The following holds true: |(f(local intensity maximum of the circuit pattern)-f(local intensity maximum of the measurement mark)|/|f(local intensity maximum of the circuit pattern) |≦0.15, where f(local intensity maximum)=f(fx, fy) is the space domain frequency in the Fourier spectrum at which the corresponding intensity maximum occurs.

On account of the above-described aberrations of the lens optics of modern lithographic projection systems, micropatterned measurement marks are imaged differently than standard measurement marks having the same lateral extent that are not subpatterned any further. In other words, the measurement mark suffers a positional deviation from a desired position, which is dependent on the type of micropatterning. For accurately detecting the overlay error of the circuit structure to be transferred with the mask, the measurement mark with a micropatterning is provided such that the positional deviation of the further measurement mark corresponds to that of the most overlay-critical structure of the circuit pattern. Consequently, the positional deviation of the most overlay-critical structure is relatively precisely detected by the measurement and compensated for using known methods of overlay error correction.

As has surprisingly been discovered according to the invention, the correspondence of the positional deviation between the most overlay-critical structure and the micropatterning of the further measurement mark is provided when the Fourier spectrum of the micropatterning in the space domain relatively corresponds to that of the most overlay-critical structure. The actual micropatterning need not be identical in both cases. In particular, additional sub-resolution assist structures that do not print on the substrate within the micropatterning of the further measurement marks are provided. The additional structures are, for example, situated at the edge of the microstructures.

The further measurement mark according to the invention is transferred, for instance, into a photoresist material as topmost layer on a semiconductor substrate and measured there in relation to further standard measurement marks for determining the positional deviation in the same or a different layer.

The measurement marks may have at least two partial structures with an identical micropatterning, i.e, when the at least two partial structures are suitable for determining the positional deviation respectively in the x and y directions.

As an alternative, the partial structures may also have a respectively different micropatterning and be suitable for determining the positional deviation of a plurality of different circuit structures.

Further, micropatterned measurement marks are provided, for instance, in the same layer as the standard measurement mark of the arrangement. In this case, since both the micropatterned measurement marks and the standard measurement mark are transferred with a single mask and a reciprocal alignment error thus vanishes, the positional shift caused by the micropatterning or the additional optical imaging error of the projection system can be accurately determined.

As an alternative, in accordance with the arrangement of standard and further measurement marks, the micropatterned measurement marks can be arranged in an upper layer above a lower layer with the standard measurement mark.

Such an arrangement of measurement marks includes, for instance, an additional standard measurement mark arranged in the upper layer, e.g., the photoresist layer. With such an arrangement the relative structure shift between standard measurement mark and the further measurement marks and the overlay error between the two standard measurement marks can be determined.

Such an arrangement may furthermore also include an additional set of micropatterned further measurement marks of test structures in the lower layer. Since the relative structure shift between standard measurement mark and further measurement marks can then likewise be determined in the lower layer. The actual overlay error between the circuit structures present in the two layers can be determined relatively accurately.

In accordance with the present invention, in the arrangement of measurement marks described, each micropatterned further and/or standard measurement mark has, for instance, rectangles. The rectangles of one mark have the same size, which differs from the rectangles of another measurement mark. These are arranged along the periphery of an imaginary square. The squares of the different marks are, for example, arranged relatively concentrically with respect to one another about a common midpoint. In this case, each individual measurement mark includes four measurement bars as have customarily been used hitherto in a form not subpatterned any further. With such an arrangement, the measurement of the overlay error, more precisely, the determination of the position of the measurement bars in the photoresist layer, can be carried out with overlay measuring devices that are customarily used and are sufficiently known to the person skilled in the art.

In this case, the overlay error is determined such that the outer boundary lines of the marks, but not their detailed microstructures are detected. The overlay error can then be relatively accurately detected from the position of the outer boundary lines, e.g., of a rectangle described above.

Consequently, the individual measurement of the overlay error and its correction using conventional measurement systems in which the numerical aperture is set, as will be explained below, can occur. Because the micropatterning of the further measurement marks is not resolved, the measurement method is also insensitive to errors that are not attributable to the exposure method, but rather to the method steps for the treatment of the photoresist material.

A measurement mark can have dummy structures, which are arranged at the outer edges thereof and dimensioned such that the dummy structures are not transferred into the photoresist layer. The dummy structures can reduce the disturbing influence of coma aberrations.

As already mentioned, the micropatterned measurement bars of the further measurement marks suffer a similar positional deviation to the circuit structures during the transfer into the photoresist material due to aberrations. In order to determine the overlay error, e.g., after the development of the photoresist material, the boundary lines of the measurement bars are determined without resolving the micropatterning. The assist dummy structures provide for a sharp imaging of the boundary lines of the measurement bars in the photoresist material. Without the assist dummy structures, coma aberrations would bring about a width difference between the respective outermost openings, as a result of which an additional overlay error would be feigned. The additional overlay error are not actually present.

The mask according to the invention may, for instance, be a chrome mask, halftone phase mask, or alternating phase mask. However, the mask is not restricted to these forms.

BRIEF DESCRIPTION OF THE DRAWINGS

The present invention will be explained in more detail below with reference to the accompanying drawings, in which:

FIG. 8D shows alternative mask sections for transferring the further measurement marks in the x direction for the layout shown in FIG. 8A in the bright and dark field versions;

DETAILED DESCRIPTION OF THE DRAWINGS

Figure 1A:
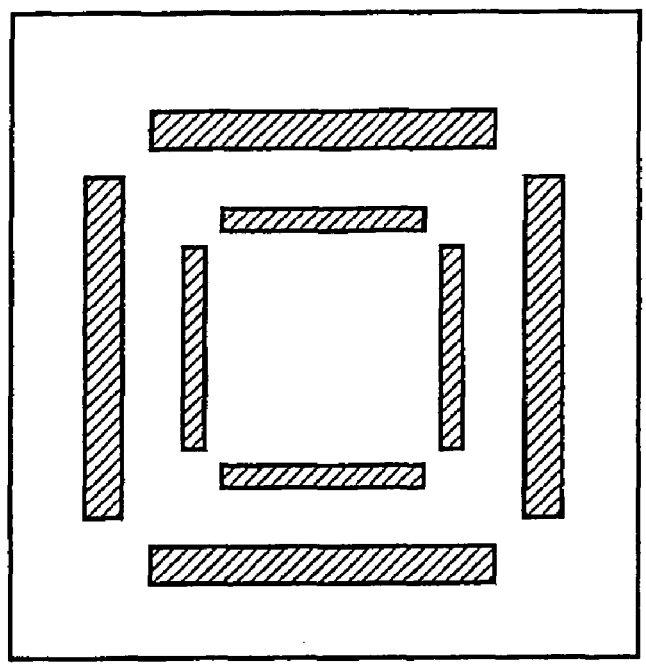
FIG. 1A shows a conventional standard measurement mark in a dark field version.
Figure 1B:
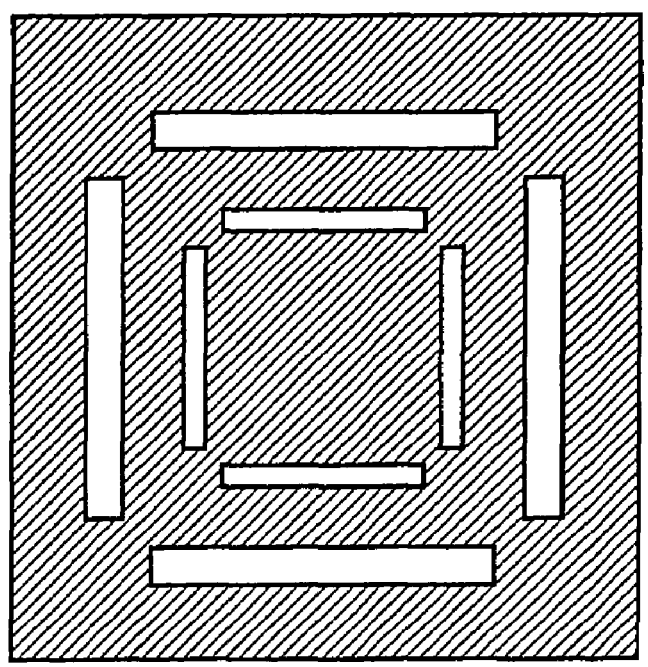
FIG. 1B shows a conventional standard measurement mark in a bright field version.
Figure 2A:
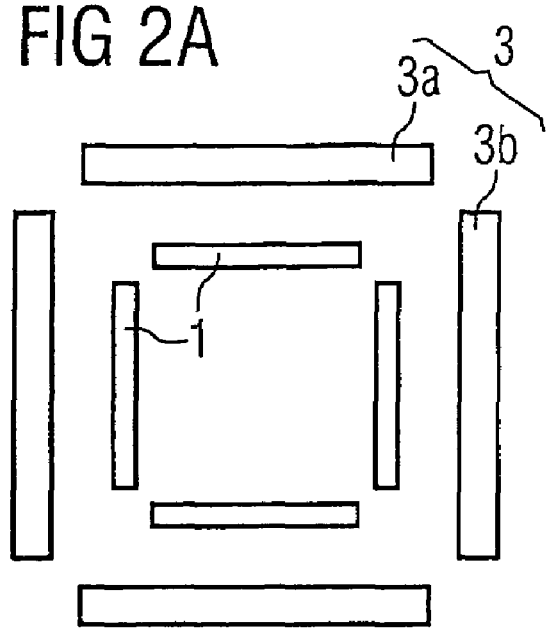
FIG. 2A shows an exemplary construction of an arrangement of measurement marks according to the invention.

FIG. 2A shows an exemplary construction of an arrangement of measurement marks that includes outer measurement bars 3a, 3b of a micropatterned further measurement mark 3 for the layer to be patterned, for instance, a photoresist layer, and inner measurement bars of a standard measurement mark 1 for the reference layer. The dimensions of the measurement bars approximately correspond to those shown in FIG. 1. In accordance with the present invention, the measurement bars 3a, 3b for the plane to be patterned now have a micropatterning adapted to the circuit pattern to be transferred. The outer and inner measurement bars can be interchanged with one another in accordance with the present invention.

Figure 2B:
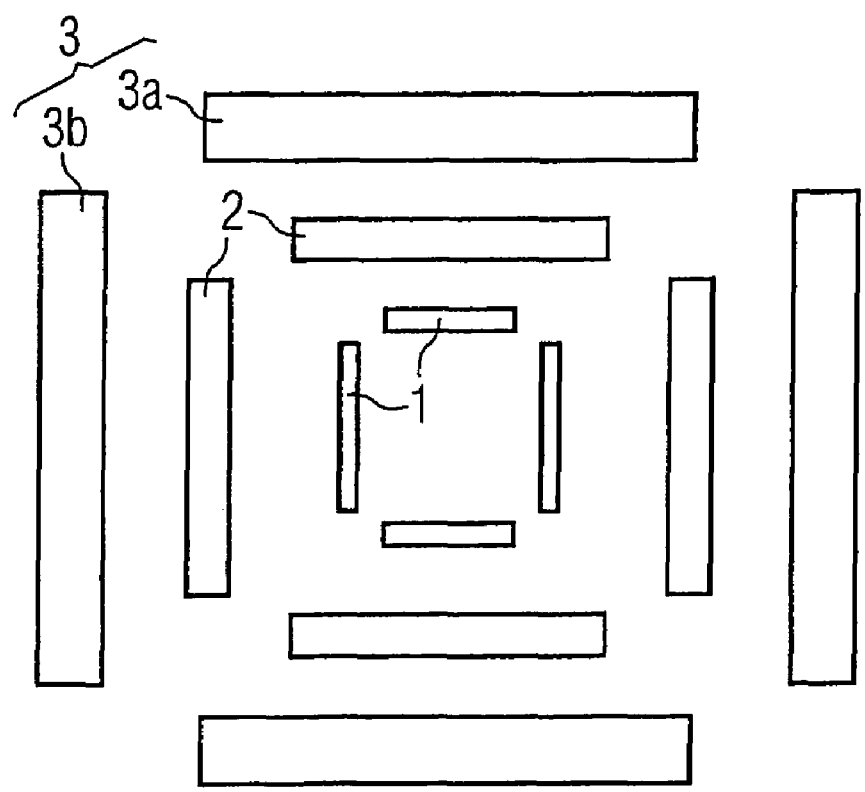
FIG. 2B shows an alternative construction of an arrangement of measurement marks according to the invention.

The arrangement shown in FIG. 2B may also be used as an alternative. This arrangement includes inner measurement bars of a standard measurement mark 1 for the reference layer, central, non-subpatterned measurement bars of a second standard measurement mark 2 for the plane to be patterned, and outer, micropatterned measurement bars 3a, 3b of a further measurement mark 3 for the plane to be patterned. In this case, the inner measurement bars 1 may likewise be micropatterned. However, the outer, inner and central measurement bars can be interchanged with one another.

An explanation is given below of the type of micropatterning of the further measurement marks 3 according to the invention for circuit structures that are to be transferred, respectively. The microstructure of the first bars 3a, 3b is chosen such that the shift of the micropatterned bars 3a, 3b on account of the aberrations described above approximately corresponds to the shift of the associated circuit structures. This is the case if the Fourier spectrum of the further measurement mark corresponds or at least comes very near to the Fourier spectrum of the circuit structure of interest.

In the case of the embodiments described, the masks for transferring the circuit patterns and the further measurement marks may be any desired masks that are used photolithographically, in particular, including alternating phase masks, halftone phase masks, and chrome masks.

Figure 3A:
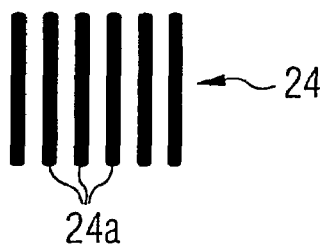
FIG. 3A shows an exemplary layout of a circuit structure to be created in accordance with a first embodiment of the invention.
Figure 3B:
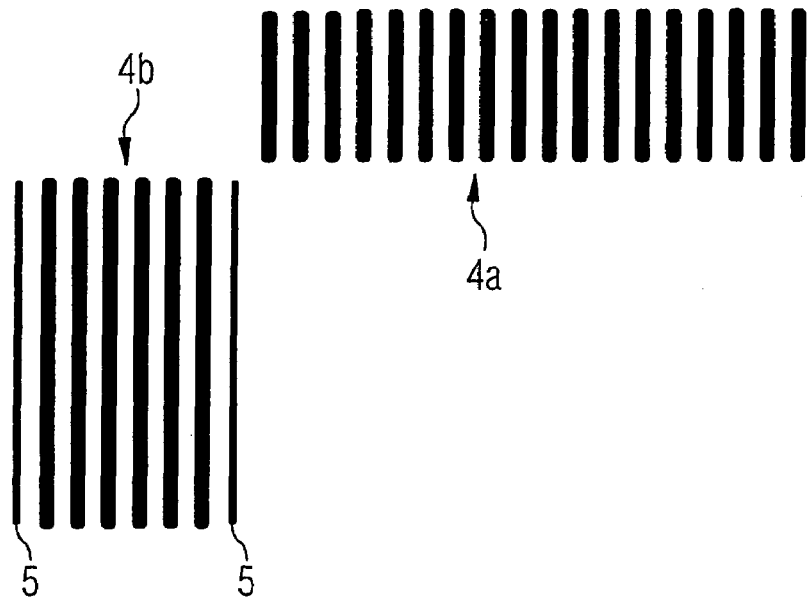
FIG. 3B shows a mask section for transferring the further measurement mark for the layout shown in FIG. 3A in the bright field version.
Figure 3C:
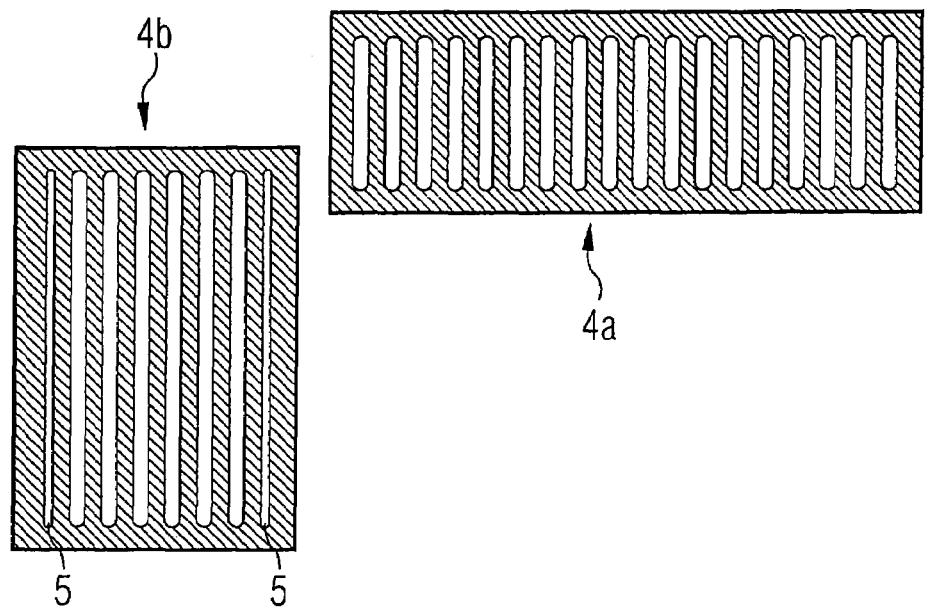
FIG. 3C shows a mask section for transferring the further measurement mark for the layout shown in FIG. 3A in the dark field version.
Figure 4A:
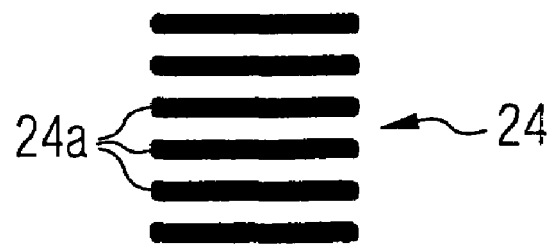
FIG. 4A shows an alternative layout of a circuit structure to be created in accordance with a first embodiment of the invention.

In accordance with a first embodiment, the circuit pattern 24 to be transferred with the mask is a grating-like structure having a duty cycle, i.e., a ratio of width to spacing, of about 1. In this case, the grating may be formed vertically, as shown in FIG. 3A, or horizontally, as shown in FIG. 4A. The grating shown in FIG. 3A may be used, for example, for the patterning of the gate contacts during the fabrication of DRAM cell arrays (dynamic random access memory). FIG. 3B shows a mask section for transferring the correspondingly micropatterned measurement bars 4a for the y direction and the measurement bars 4b for the x direction in the bright field version, and FIG. 3C shows a mask section for transferring the corresponding micropatterned measurement bars in the dark field version.

The measurement bars for the Y direction and the X direction are patterned such that their Fourier spectrum corresponds to that of the circuit structure shown in FIG. 3A. The spacing of the lines or the line width in this case corresponds to the typical dimensioning for the respective technology used, i.e., that is to say 110 nm in the case of 110 nm technology.

The measurement bars 4b for the X direction additionally have assist dummy structures 5, for example, at the right-hand and left-hand edge, i.e., grating lines with the same period, but a smaller width than the grating lines of the micropatterning.

In this case, the dimensioning of the assist dummy structures 5 is chosen such that the dummy structures are not transferred into the resist structure. More precisely, in the present case with 110 nm technology, the width of the assist dummy structures 5 is 40 to 70 nm. The assist dummy structures 5 serve to reduce the disturbing influence of coma aberrations. Without these assist dummy structures 5, coma aberrations would bring about a width difference between the grating lines respectively situated at the edge. As a result, an overlay error actually present would be feigned. The applied assist dummy structures 5 have the effect that the outer structures that print in the resist 26 on the substrate 9 have relatively negligible width difference.

Figure 4B:
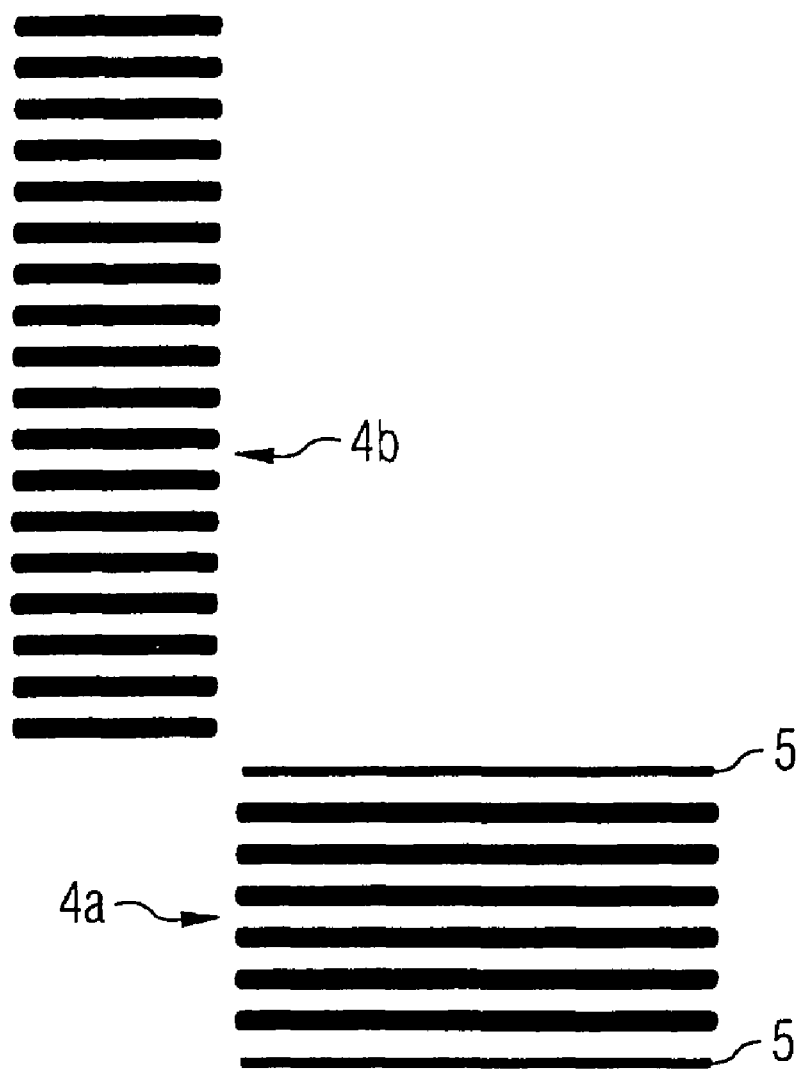
FIG. 4B shows a mask section for transferring the further measurement mark for the layout shown in FIG. 4A in the bright field version.
Figure 4C:
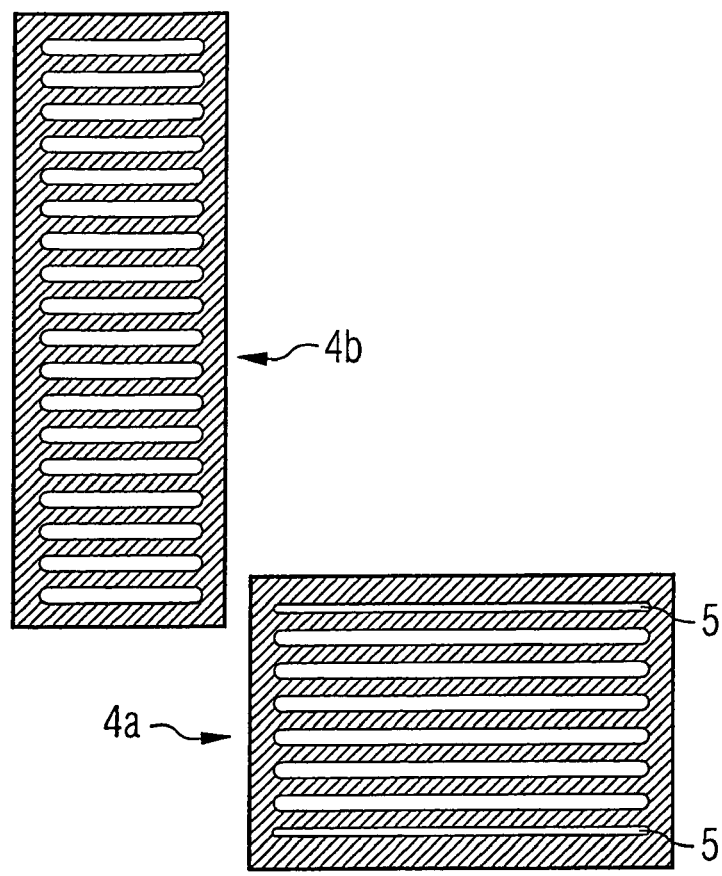
FIG. 4C shows a mask section for transferring the further measurement mark for the layout shown in FIG. 4A in the dark field version.

FIGS. 4B and 4C show a mask section for transferring the further, micropatterned measurement mark 3 according to the invention for the circuit pattern 24 to be transferred that is shown in FIG. 4A. The circuit pattern shown in FIG. 4A may be used, for example, for the patterning of metallization planes during the fabrication of DRAM cell arrays. Here, too, the Y test structures 3a each have assist dummy structures 5 for suppressing coma aberration effects. Here, too, the spacing of the lines or the line width is 110 nm, while the width of the assist dummy structures 5 is, e.g., 40 to 70 nm.

For some applications, for example, logic circuits, it is not infrequently the case that two structures 24a that deviate from one another in terms of their geometry are overlay-critical. In this case, in accordance with the present invention, a further micropatterned overlay measurement mark can be created by assuming that these structures are constructed from grating-like structures having the same width with a different period. Accordingly, a further micropatterned overlay measurement mark having a different period is provided for each of said structures.

A comparable procedure is provided if vertically and horizontally oriented structures with a critical overlay are imaged.

Figure 5A:
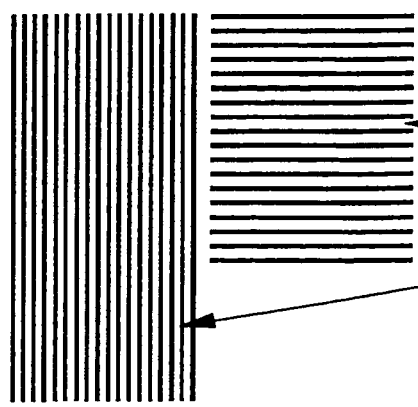
FIG. 5 shows a mask section for transferring the further measurement mark for a layout which combines the layouts shown in FIGS. 3A and 4A.
Figure 5B:
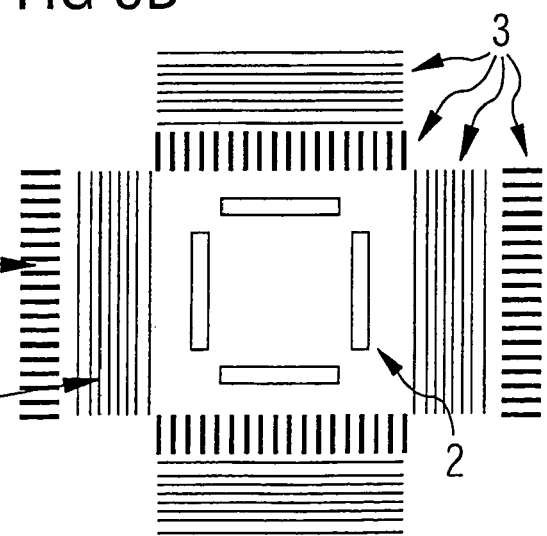

FIGS. 5A and 5B show a measurement mark 3 according to the invention for a vertically and a horizontally oriented grating-like structure having a different period. In FIG. 5A, two different micropatterned partial structures are generated for each of the grating-like structures, while in FIG. 5B both partial structures are integrated to form a single measurement mark 3. With such an integrated measurement mark, the overlay error measurement of both partial structures can be carried out in one image scanning operation.

For the overlay correction, both partial structures are measured for each direction with regard to the overlay error. The overlay error included in the calculation of the overlay correction then results from the average value of the two errors determined per image point. However, it is likewise possible to calculate the measured values for both measurement marks in weighted fashion for determining the overlay correction value. This is expedient, for example, when the overlay specifications for the circuit or the corresponding structures deviate somewhat from one another.

Figure 6A:
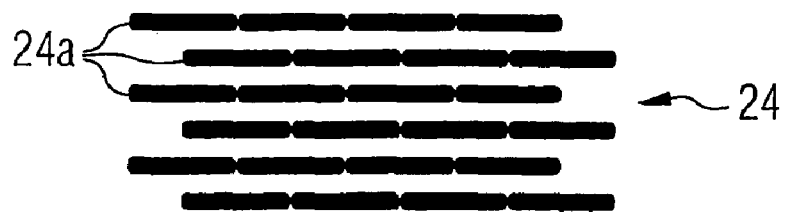
FIG. 6A shows a layout of a circuit structure to be created in accordance with a second embodiment of the invention.
Figure 6B:
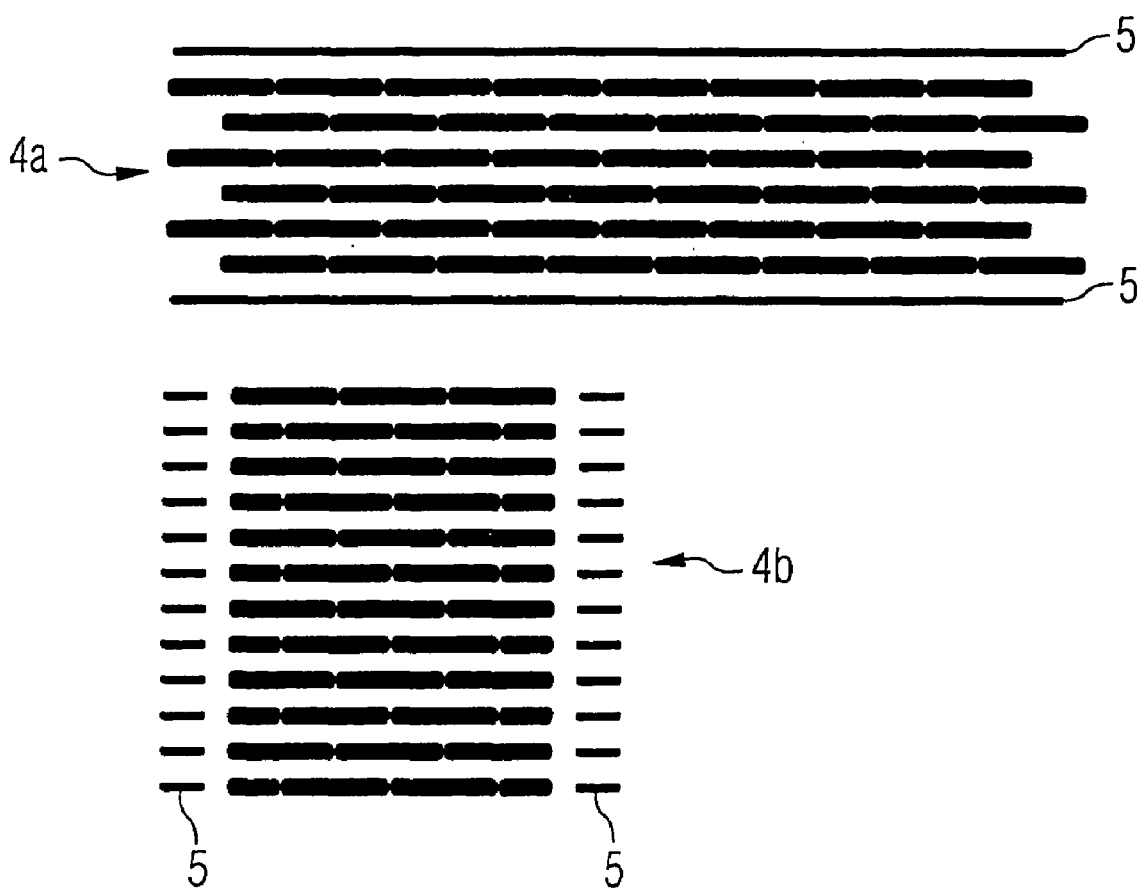
FIG. 6B shows a mask section for transferring the further measurement mark for the layout shown in FIG. 6A in the bright field version.

A second embodiment of the present invention is shown in FIG. 6. In this case, the circuit pattern 24 to be transferred has two mutually offset gratings comprising mutually parallel line sections, as shown in FIG. 6A. These line sections 24a may be used to define the active areas during the method for fabricating a DRAM arrangement. Accordingly, the line widths and the spacings are chosen such that they correspond to the typical dimensions of the active areas in the present technology, for example, the 110 nm technology. The mask sections for transferring the corresponding measurement marks according to the invention for the circuit pattern shown in FIG. 6A are shown in FIG. 6B. Here, both the regions for transferring the y partial structure 4a and the regions for transferring the x partial structure 4b have assist dummy structures 5 at their outer edge.

The assist dummy structures 5, whose distance from the partial structure in the x direction corresponds to the distance between the individual lines, have a size of 40 to 70 nm, so that their structure is not transferred into the photoresist material. The assist dummy structures of the y partial structure 4a are formed in line-type fashion, while the assist dummy structures of the x partial structure 4b comprise individual strokes. In this respect, the mask sections for transferring x and y partial structures differ in particular in the arrangement of the assist dummy structures 5. The x and y test structures transferred into the photoresist material have an identical micropatterning.

Figure 6C:
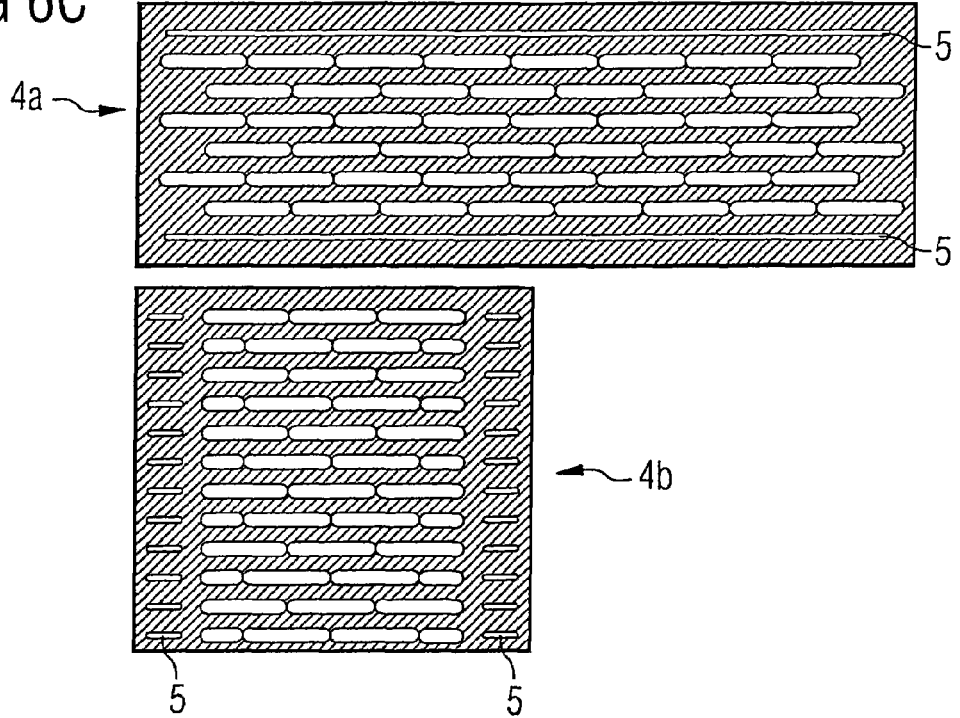
FIG. 6C shows a mask section for transferring the further measurement mark for the layout shown in FIG. 6A in the dark field version.

FIG. 6C shows the corresponding mask regions for transferring the x and y partial structures in the dark field version.

In the case of the embodiments described above, relatively simple circuit patterns 24 are transferred, so that the corresponding partial structures are patterned in the same way and therefore experience a similar shift to the circuit pattern during the transfer into the photoresist material. In the case of more difficult patterns, a similar shift during the transfer into the photoresist material can be deduced from an examination of the respective Fourier spectra.

Figure 7A:
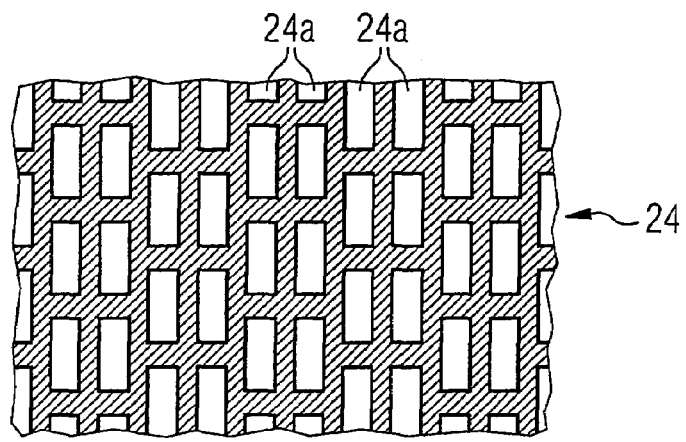
FIG. 7A shows a layout of a circuit structure to be created in accordance with a third embodiment of the invention.

In accordance with a third embodiment, a micropatterned measurement mark has been designed for the circuit structure shown in FIG. 7A. FIG. 7A shows a mask section for the patterning of the capacitor trenches in a DRAM memory cell array. Here, too, the dimensioning of the capacitor trenches is selected in accordance with the typical feature sizes used in the respective technology, i.e., here, the 110 nm technology. FIG. 7D shows the Fourier spectrum of the arrangement shown in FIG. 7A.

Figure 7B:
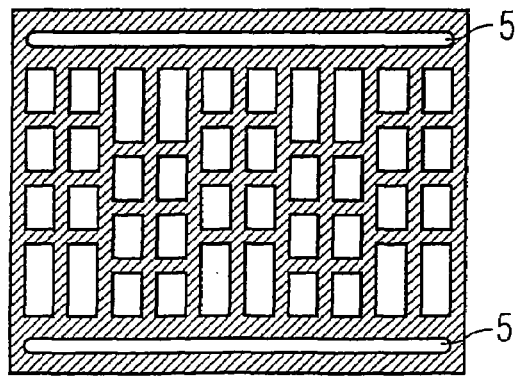
FIG. 7B shows a mask section for transferring the further measurement mark in the y direction for the layout shown in FIG. 7A in the bright field version.
Figure 7C:
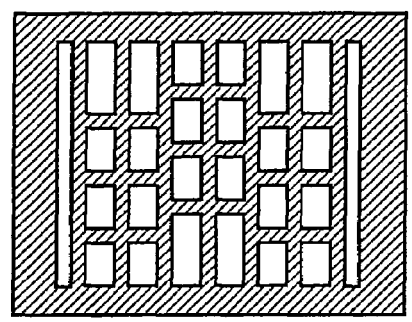
FIG. 7C shows a mask section for transferring the further measurement mark in the x direction for the layout shown in FIG. 7A in the bright field version.
Figure 7D:
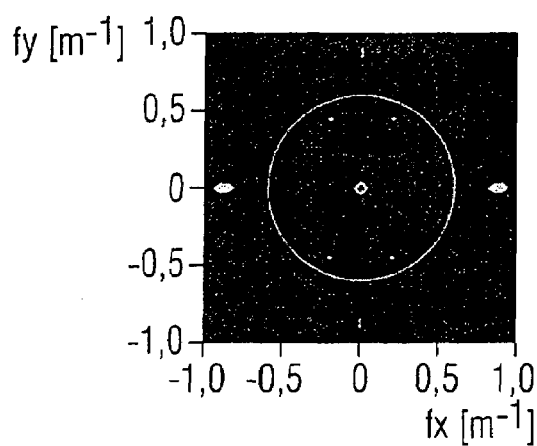
FIG. 7D shows a Fourier spectrum of the layout shown in FIG. 7A.
Figure 7E:
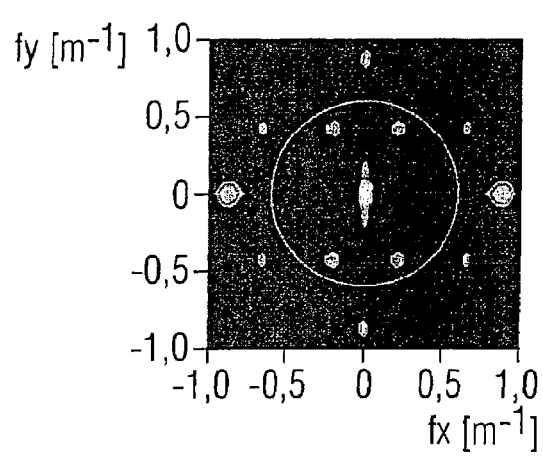
FIG. 7E shows a Fourier spectrum of the further measurement mark shown in FIG. 7B.

FIG. 7B shows a mask section for transferring the measurement mark according to the invention for determining the overlay error in the y direction, while FIG. 7C shows a mask section for transferring the measurement mark according to the invention for determining the overlay error in the x direction. FIG. 7E shows the Fourier spectrum of the partial structures shown in FIGS. 7B and 7C.

The points arranged on the circle circumference indicate the position of the aperture diaphragm and thus do not belong to the Fourier spectrum of the respective micropatterning. As emerges from the comparison, for each intensity maximum of the spectrum in FIG. 7D there is a corresponding intensity maximum in FIG. 7E which lies in a similar spatial frequency range. The mask sections for the x and y partial structures differ only in the orientation of the assist dummy structures 5, which are again provided in order to reduce the disturbing influences of coma aberrations, etc. The respective substructures are lengthened in the vicinity of the upper and lower edge of the partial structures in order to ensure that a uniform upper and lower edge of the partial structures transferred in the photoresist is achieved. The x and y partial structures transferred into the photoresist material, for example, have an identical micropatterning.

Figure 8A:
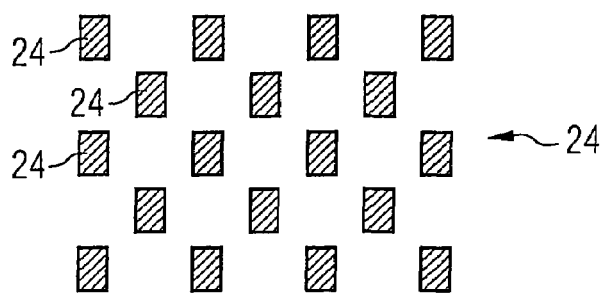
FIG. 8A shows a layout of a circuit structure to be created in accordance with a third embodiment of the invention.

FIG. 8A shows a mask section for transferring bit line contacts for a DRAM cell array, for example for the 110 nm technology.

Figure 8B:
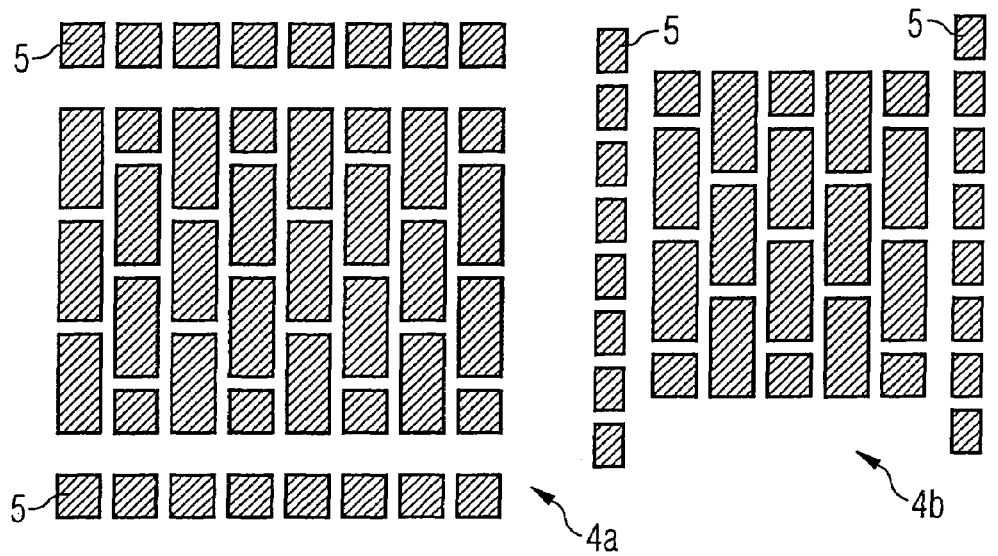
FIG. 8B shows a mask section for transferring the further measurement mark for the layout shown in FIG. 8A in the bright field version.
Figure 8C:
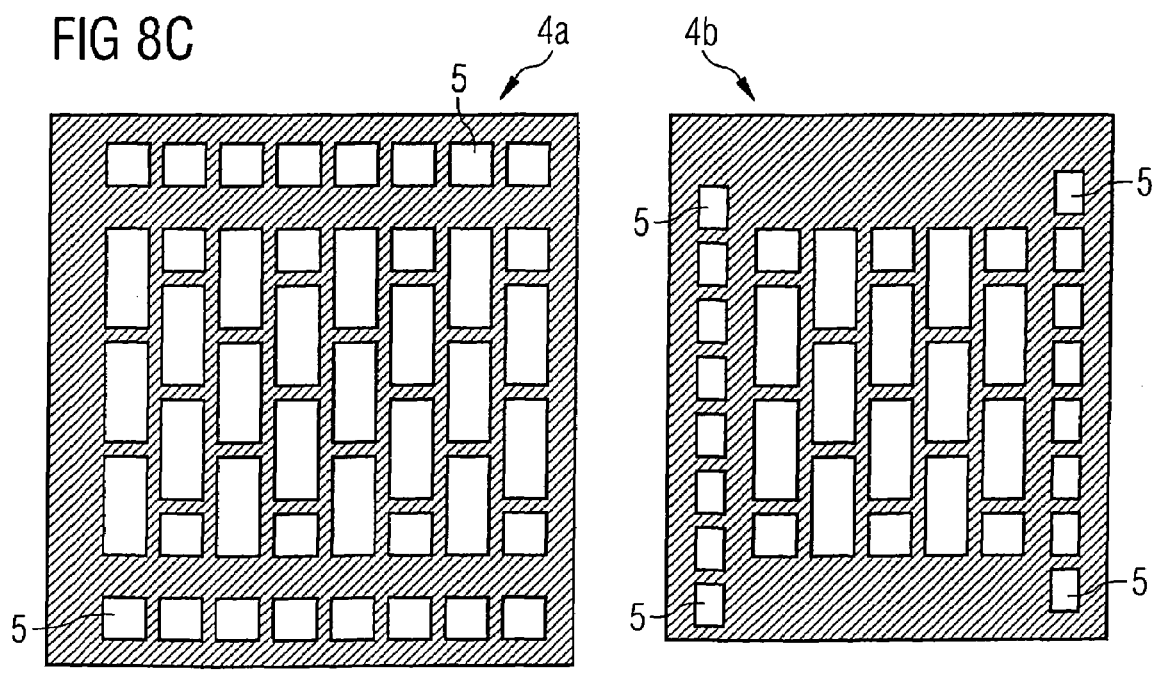
FIG. 8C shows a mask section for transferring the further measurement mark for the layout shown in FIG. 8A in the dark field version.

FIG. 8B shows a mask section for transferring the corresponding y partial structures 4A and the corresponding x partial structures 4b in a dark field version, while FIG. 8C shows a mask section for transferring the y partial structures 4a and the x partial structures 4B in a bright field version.

FIG. 8D shows alternative mask sections 4b for transferring the partial structures for determining the overlay error in the x direction, in which case the assist dummy structures 5 are formed differently than in FIG. 8B or FIG. 8C.

Figure 9:
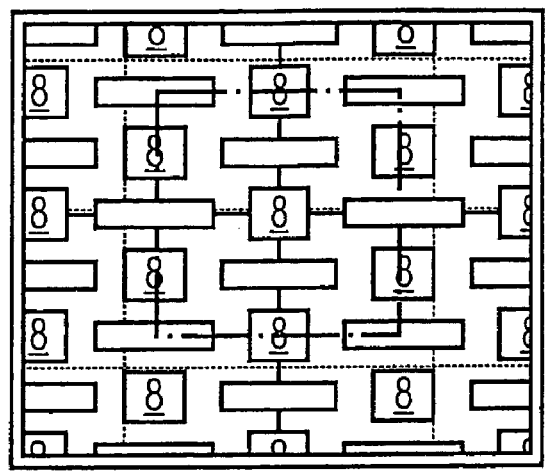
FIG. 9 shows an exemplary layout of a circuit structure to be created in accordance with a fifth embodiment of the present invention.

FIG. 9 shows a detail from a mask for patterning holes for making contact with the gates in a DRAM cell array. Here, the reference symbol 8 designates the contact holes.

Figure 10:
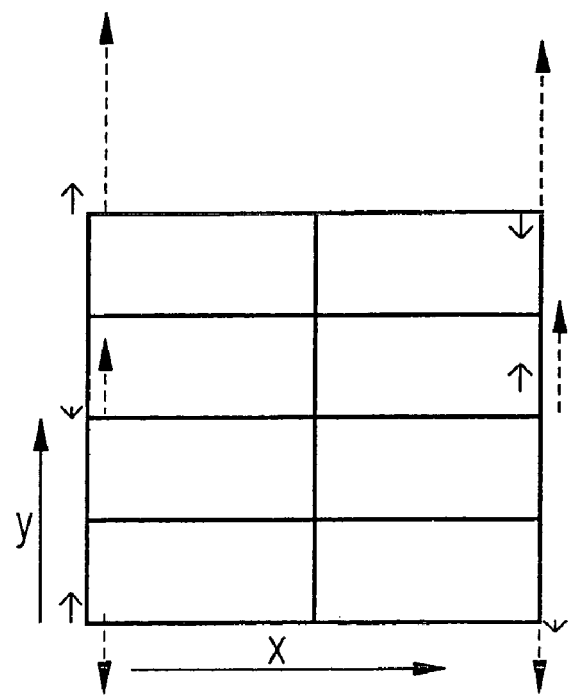
FIG. 10 shows the resulting overlay error respectively measured at the standard measurement mark shown in FIG. 1B and at the circuit structures shown in FIG. 9.

If the circuit structure shown in FIG. 9 is created on a wafer, then with the use of the overlay standard measurement marks used in FIG. 1, the y overlay errors shown in FIG. 10 result at the upper and lower edge and also in the center of the image field of a projection system after the etching of the metallization layer. In this case, the respective overlay measurement errors (overlay errors) are specified in the form of a vector in FIG. 10. As can be seen in FIG. 10, distinct differences are produced in the measurement results between the contacts and metal lines, which, measured by the conventional methods, were ultimately not previously detected.

Instead of an error of 30 nm occurring in the circuit at the upper figure field edge, only an error of approximately 5 nm is determined at the conventional overlay standard measurement mark. It is likewise clearly discernible that the deviation of the overlay errors determined is dependent on the position within the image field.

Figure 11:
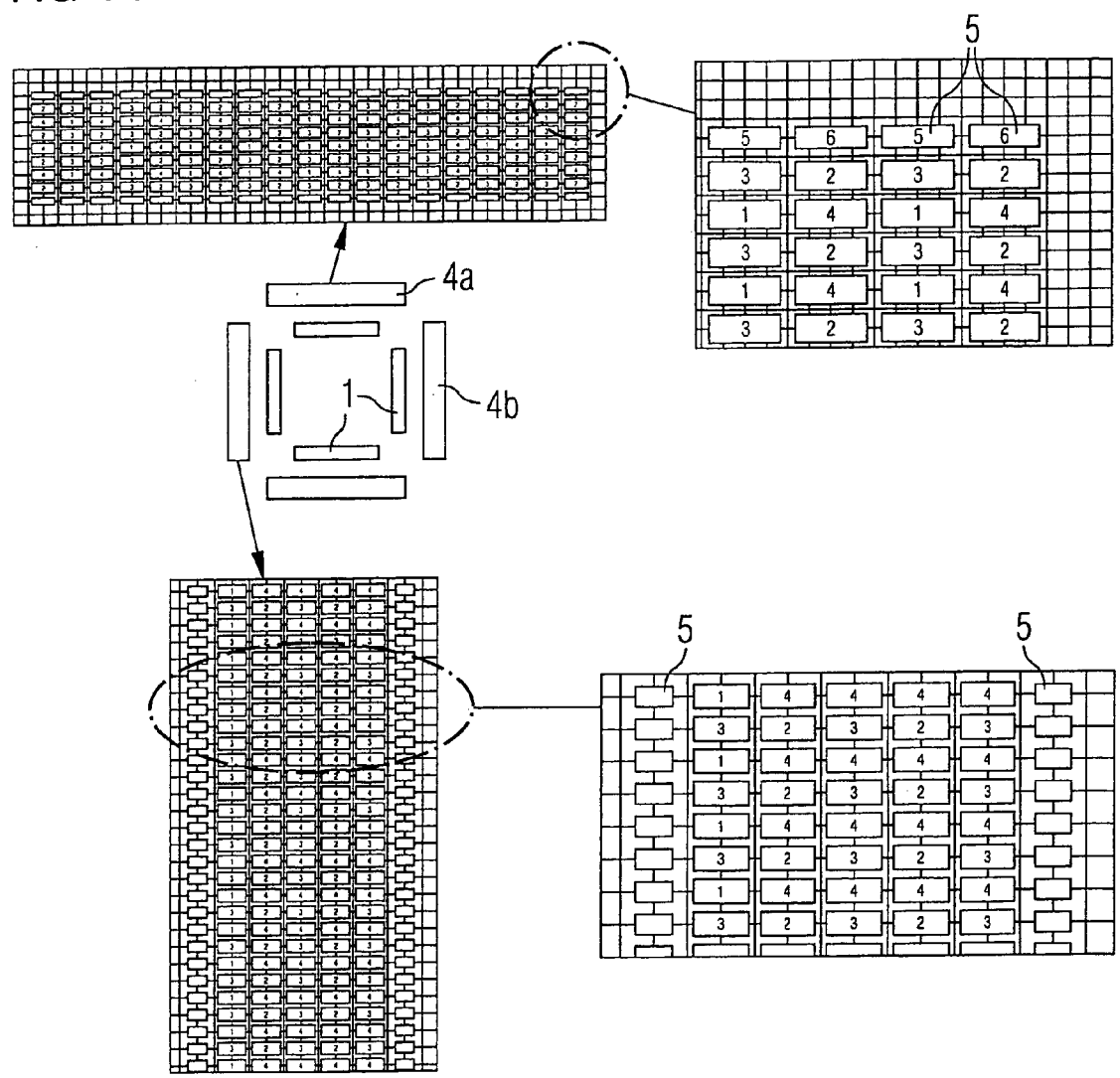
FIG. 11 shows a mask section, corresponding to the layout illustrated in FIG. 9 for transferring the further measurement mark in accordance with the fifth embodiment.

FIG. 11 now shows a mask section for transferring a measurement mark 3 in accordance with a fifth embodiment of the present invention, which is configured specially for the layout shown in FIG. 9. The mask section for transferring the overlay test structure as shown in FIG. 11 includes four rectangular first bars 4a, 4b, arranged along the periphery of an imaginary first square, for a second patterning plane, for example, the gate contact-making plane, and four further rectangular second bars of a standard measurement mark 1, arranged along the periphery of an imaginary second square, which is arranged relatively concentrically with and relatively parallel to the first square, for the reference plane, i.e., a previously patterned first plane onto which the second patterning plane is to be overlaid. As also in the previous embodiments, the mask sections for the bars 4a, 4b have a microstructure that is chosen such that the shift of this microstructure approximately corresponds to the shift of the circuit structures shown in FIG. 10. More precisely, the overlay measurement mark according to the invention, as shown in FIG. 11, has an arrangement of transparent rectangles, the phase deviation changing alternately between 0° and 180°.

The mask section for the transfer of the Y overlay partial structure 4A of a measurement mark 3 according to the invention again has, at the upper and lower edge, a series of dimension-reduced openings of alternating phase, the dimensioning being chosen such that the rectangles are not transferred into the resist. These assist dummy structures 5 serve to reduce the disturbing influence of coma aberrations. Without these assist dummy structures 5, coma aberrations would bring about a width difference between the respective outermost openings. As a result, a non-existent overlay error would be determined. The applied assist dummy structures 5 have the effect that the outer structures which print have no or a negligible width difference. As can be seen in FIG. 11, the mask section for the Y overlay partial structure 4a and that for the X partial structure 4b differ in the configuration of the phase dummy structures 5.

In this case, the micropatterning of the first bars 4a, 4b is chosen, for example, such that the Fourier spectrum of the overlay measurement mark 3 corresponds or at least comes relatively near to the Fourier spectrum of the circuit structure of interest.

Figure 12A:
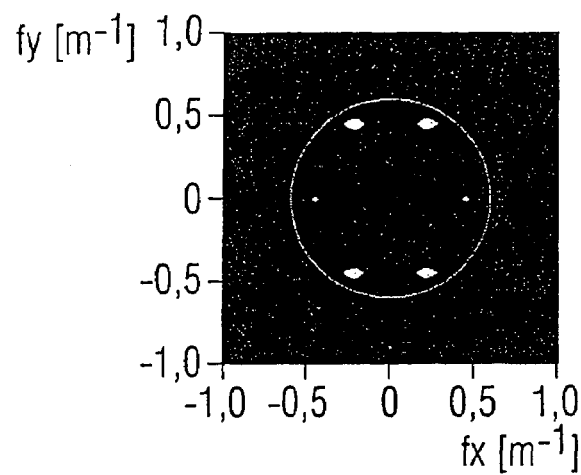
FIG. 12A shows the Fourier spectrum of the layout shown in FIG. 9.
Figure 12B:
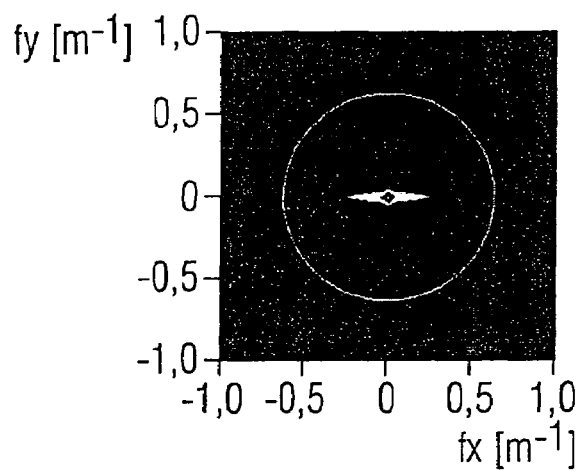
FIG. 12B shows the Fourier spectrum of the conventional standard measurement mark shown in FIGS. 1A and 1B.
Figure 12C:
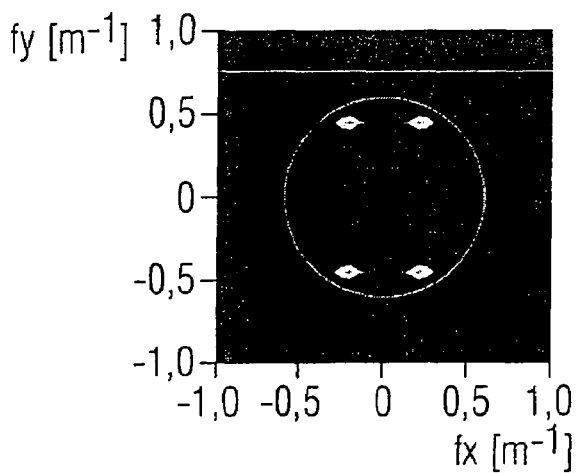
FIG. 12C shows the Fourier spectrum of the further measurement mark shown in FIG. 11.

FIG. 12A shows the Fourier spectrum of the circuit structure shown in FIG. 9, while FIG. 12C shows the Fourier spectrum of the measurement mark according to the invention as shown in FIG. 11. As can clearly be seen, the spectra shown in FIG. 12A and FIG. 12C are very similar to one another apart from two weak-intensity maxima in FIG. 12A. More precisely, for the variety of intensity maxima of the Fourier spectrum of FIG. 12A there are corresponding intensity maxima of the Fourier spectrum of FIG. 12C, which, for example, lie in a similar spatial frequency range.

The points arranged on a circle circumference represent the position of an aperture diaphragm, and thus, do not belong to the Fourier spectrum of the respective micropatterning.

Figure 13:
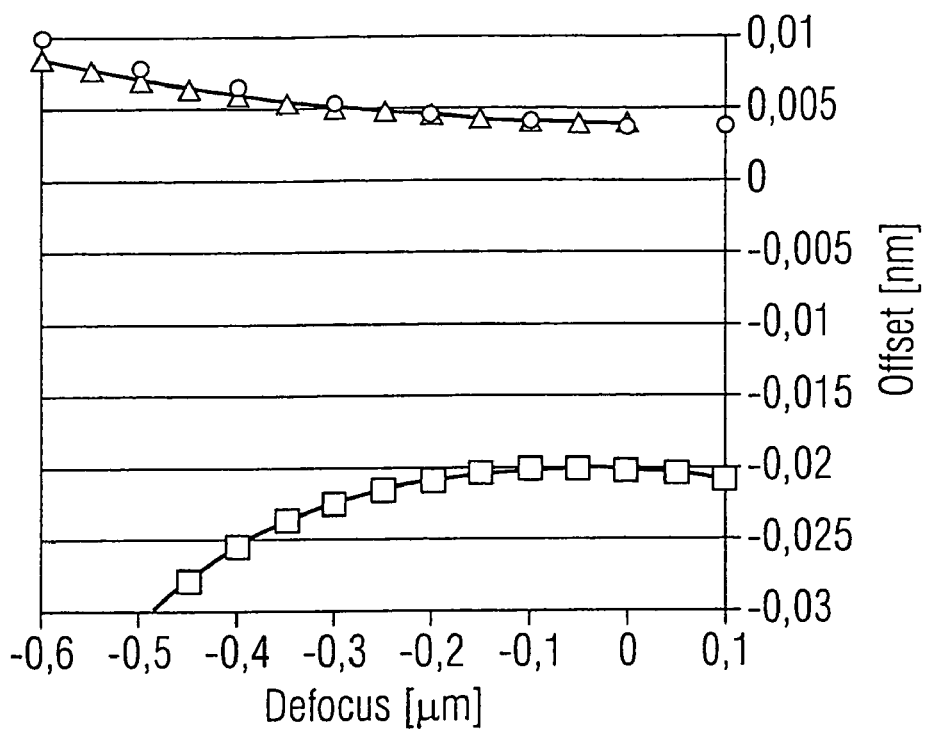
FIG. 13 shows the overlay error for the layout shown in FIG. 9, the standard measurement mark shown in FIG. 1B and the further measurement mark according to the invention as shown in FIG. 11.

As the inventors of the present invention have discovered, under this condition the aberration-dictated overlay errors of circuit structure to be transferred and micropatterned measurement mark correspond, as is shown in FIG. 13. The overlay error is plotted against the defocus in FIG. 13. The very good correspondence between the curves for the circuit structure and the overlay measurement mark according to the invention is evident. By contrast, the standard measurement mark corresponding to the prior art deviates significantly from the structure shift of the circuit structure. As is shown in FIG. 12B, the Fourier spectrum of the conventional overlay standard measurement mark shown in FIG. 1A also differs significantly from the spectra shown in FIGS. 12A and 12C.

Accordingly, in accordance with the present invention, the overlay error of the circuit structure shown in FIG. 9, with the overlay measurement mark according to the invention, will be detected precisely and then compensated for by known methods of correction during alignment in a subsequent exposure step. The finally measured overlay error is then significantly lower than that which would be established after a measurement and correction using the overlay standard measurement mark shown in FIG. 1A.

Figure 15A:
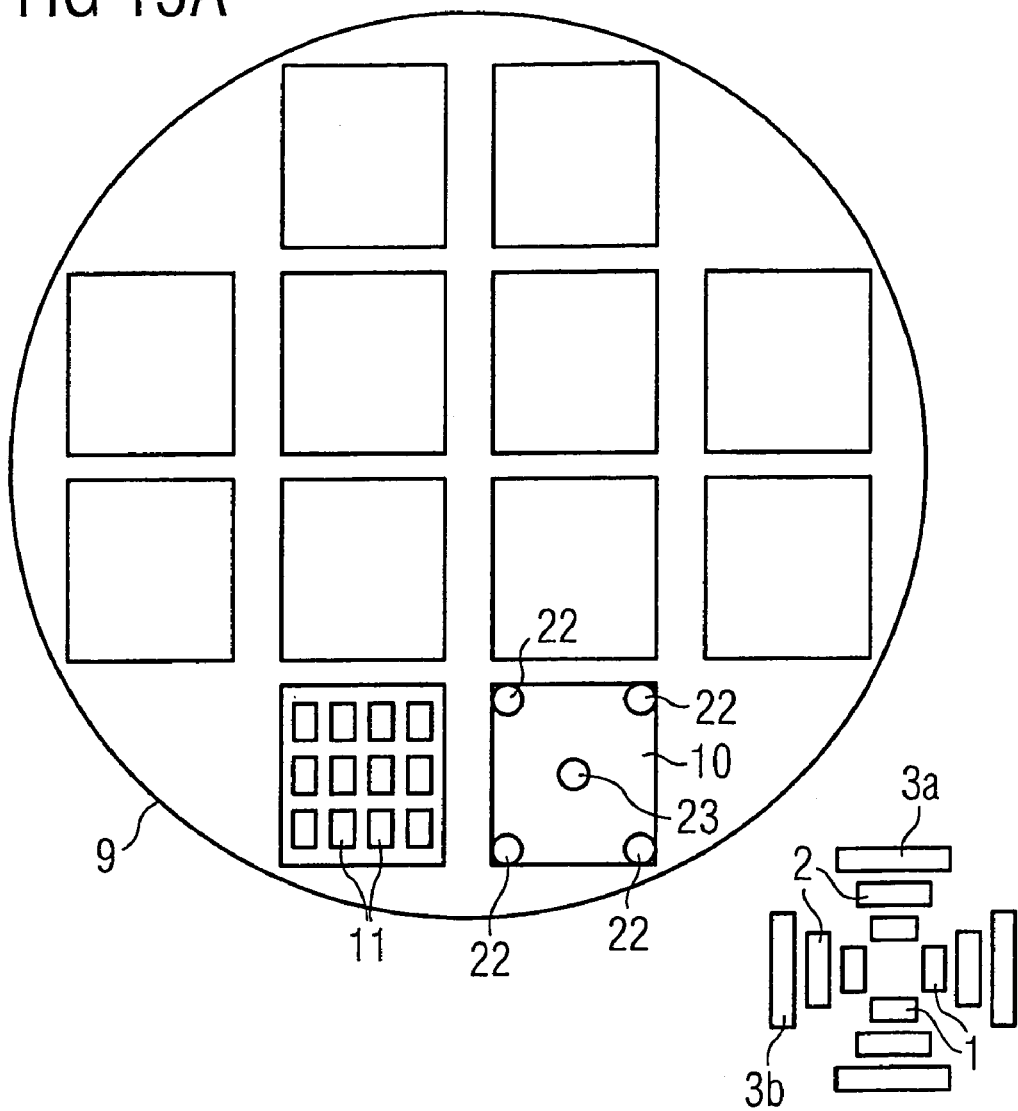
FIG. 15A shows a view of a semiconductor wafer.
Figure 15B:
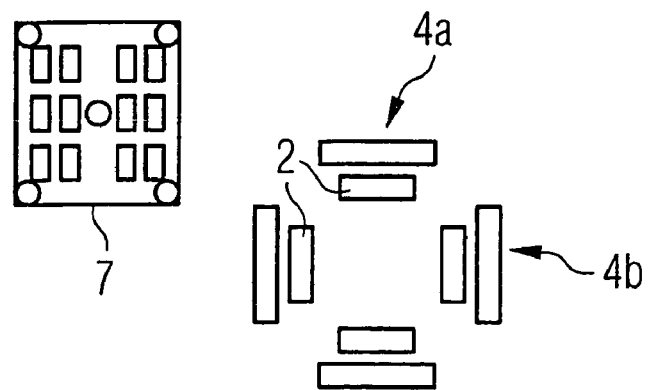
FIG. 15B shows a diagrammatic illustration of a mask.
Figure 15C:
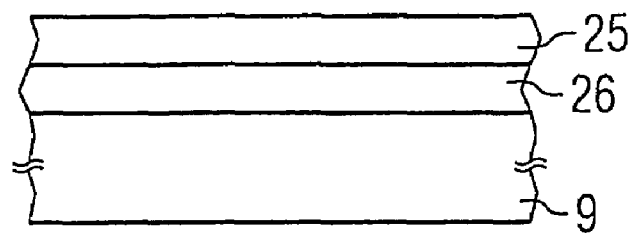
FIG. 15C shows a diagrammatic cross-sectional view through a wafer.

FIG. 15A shows a wafer 9, onto which there are transferred, by a scanning method, individual image fields 10, which, for example, each have twelve symmetrically arranged chips 11 and the pattern on the mask 7. An image field may also have a number of chips that deviates from this. On the mask 7, illustrated in FIG. 15B, a section 4a, 4b, 2 for transferring the measurement mark according to the invention and also, for instance, a standard measurement mark is respectively arranged at the four corner points and in the central point of the image field. Consequently, after the exposure and development of the wafer, each image field has, in addition to the transferred circuit pattern at the four corner points 22 and also the central point 23, a standard measurement mark 1 from a previous reference plane and at least one measurement mark 3a, 3b according to the invention and a standard measurement mark 2 from the plane to be patterned.

After the exposure of the wafer with the mask and development, a measurement for determining the overlay error is carried out. In accordance with the present invention, this measurement step may be determined according to conventional methods by detecting the edges of the mark according to the invention and of the additional marks used. From the position of the edges, the centroid positions of the measurement bars are then determined. The distance between the positions of the parallel measurement bars is calculated and compared with the reference values. A conventional measuring arrangement that is customarily used for edge detection may be used for this purpose, for example. Such a measuring arrangement is illustrated, for example, in FIG. 14.

Figure 14:
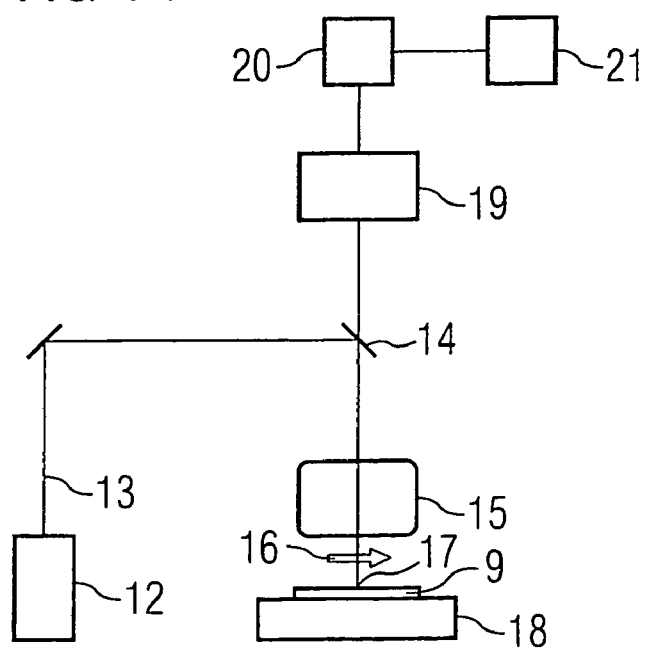
FIG. 14 shows an exemplary measuring arrangement for determining the outer boundary lines of the further measurement marks according to the invention.

In FIG. 14, the reference symbol 12 designates a light source, the reference symbol 13 designates a beam path, the reference symbol 14 designates a semitransparent mirror, the reference symbol 15 designates an objective for imaging the light beam on the wafer, the reference symbol 16 designates a scanning direction of the wafer, the reference symbol 17 designates an illumination slot at the wafer, and the reference symbol 18 designates an x-y table for mounting and moving the wafer 9. The light beam 13 is reflected from the wafer 9 and passes via the partly transparent mirror 14 to a camera 19, for example, a CCD camera, for recording the reflected intensity. The data determined are stored in the storage device 20 and processed in the processing unit 21 in order to determine the corresponding correction parameters.

The present invention provides for the numerical aperture of the objective 15 and the wavelength of the measurement system to be set such that the microstructures of the measurement marks according to the invention are not resolved by the optical system of the measuring apparatus. This is the case when the following holds true:

$$P_{min} = (\text{line width} + \text{gap width}) = 0.5 \times (\lambda/NA)$$

The commercially available overlay measurement systems are typically provided with wavelength filters having a different spectral distribution and also with exchangeable objectives having a different numerical aperture. In the case of the embodiments described above, the maximum period of the structures is 280 nm. Accordingly, for measuring the overlay error, it is possible to use an objective with NA=0.5 and light having a wavelength of 500 nm, which corresponds to a minimum period that can be resolved of 500 nm. Given such a design of the measurement system, the maximum period of the microstructures of the measurement mark according to the invention lies significantly below the resolution limit of the measurement system.

The use of a measurement system with a numerical aperture as described above is advantageous to the effect that the higher orders of diffraction of the microstructures are not detected and only the intensity of the reflected light of the zeroth order of diffraction is detected. More precisely, the micropatterning of the measurement mark according to the invention will not be resolved. This is not actually necessary for the implementability of the present invention, since what matters is merely ascertaining the position of the further measurement mark per se.

The method according to the invention for detecting an overlay error and for reducing the overlay error is explained in more detail below.

In FIG. 15A, a wafer 9 is divided into 12 image fields 10. The reference symbols 22 designate the four corner points of the image field, while the reference symbol 23 designates the central point of the image field. An image field 10 usually has an extent in the x direction of 26 mm and an extent in the y direction of 32 mm. Since a whole number of chips 11 must always be accommodated per row and column, part of the image field area cannot be occupied. This unoccupied part must be taken into account during the determination of the correction parameters. More precisely, an image-field-related correction must be carried out.

For example, the arrangement according to the invention as shown in FIG. 2B is used for carrying out the method according to the invention. Said arrangement comprises inner, non-sub- or micropatterned measurement bars of a first standard measurement mark 1 for the reference plane, central, non-micropatterned measurement bars of a second standard measurement mark 2 for the plane to be patterned, and outer, micropatterned measurement bars 3a, 3b of a measurement mark 3 according to the invention for the plane to be patterned.

After the exposure and development of the plane to be patterned, in a first step, firstly the relative structure shift $\Delta v1=(\Delta x1, \Delta y1)$ of the plane to be patterned between, for example, the measurement bars 2 and the micropatterned measurement bars 3a, 3b is measured and stored for a predetermined number of image field points. Typically, this method is carried out at least for the four corner points 22 and the central point 23 of the image field. Afterward, according to conventional methods, the overlay error between the conventional measurement structures of the plane to be patterned and the reference plane $\Delta v1R=(\Delta x1R, \Delta y1R)$ is measured and stored for the same image field points. In this case, the actual overlay error $\Delta v1R(real)$ results from the difference between $\Delta v1R$ and $\Delta v1$ for each image field point.

The orientation correction parameters are then determined according to known methods. This may be effected, for example, in that, for each gap exposed during a scanning operation on the wafer, the actual overlay error $\Delta v1R(real)$ is plotted against the location x on the image field. This is followed by the calculation of a compensation straight line for the x coordinate. This can be used to determine the scale and translation correction parameters in the x direction according to known methods. More precisely, these parameters are to be determined such that the maximum difference in the actual overlay error assumes a minimum over the respectively exposed gap.

These data are subsequently stored for later use, the correction values being processed and stored in an image-field-related manner.

After the correction has been carried out, a check is made to determine whether the correction method was successful by measuring the respective positional errors and calculating the new overlay error according to the method described above.

For carrying out the method described above, the test structure of the reference plane may also be a test structure according to the invention.

Figure 16:
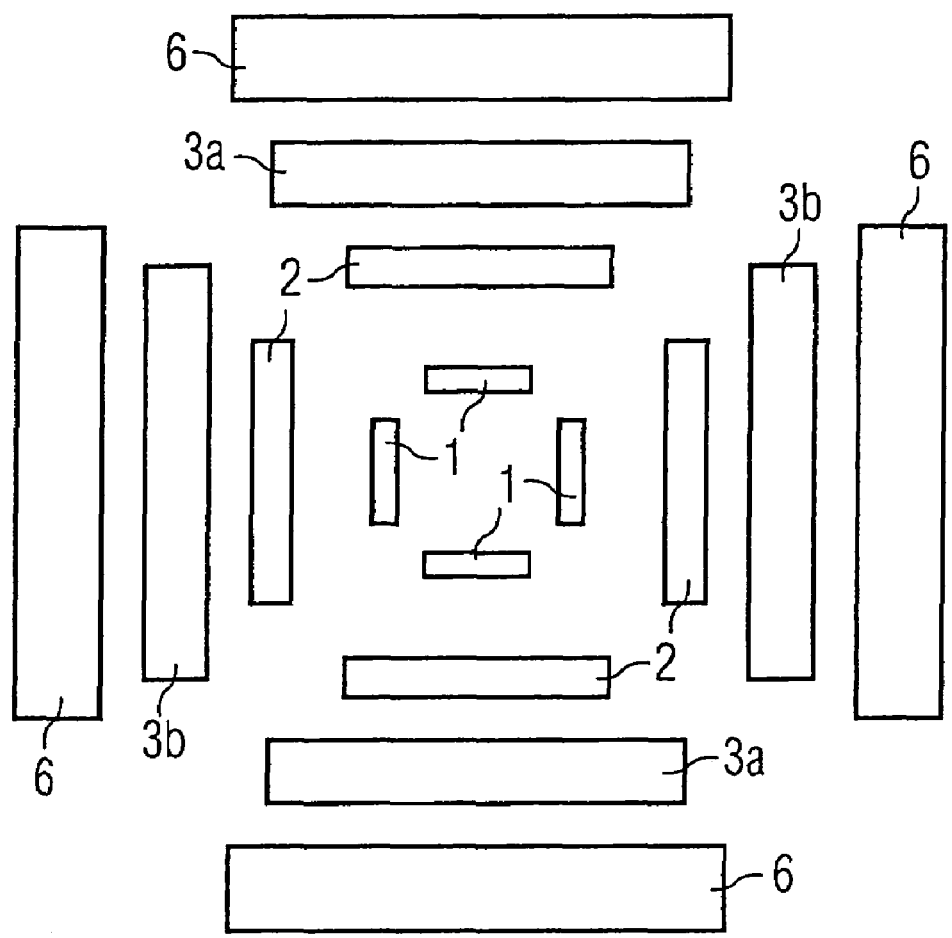
FIG. 16 shows an arrangement of measurement marks in accordance with a further embodiment of the invention.

In accordance with the present invention, the arrangement can include a standard measurement mark 2 and partial structures 3a, 3b of a first further measurement mark 3 for the plane to be patterned, and a standard measurement mark 1 and a second measurement mark 6 for the reference plane, as illustrated in FIG. 16. In this case, after the exposure and development of the reference plane, the relative structure shift $\Delta vR=(\Delta xR, \Delta yR)$ between, for example, the measurement bars 1 and the micropatterned measurement bars of the measurement mark 6 is measured and stored for a predetermined number of image field points in the photoresist. Typically, this method is again carried out at least for the four corner points 22 and the central point 23 of the image field.

After the exposure and development of the plane to be patterned, the relative structure shift $\Delta v1=(\Delta x1, \Delta y1)$ between the measurement bars 2 and the micropatterned measurement bars 3a, 3b is subsequently measured and stored for the same image field points. Afterward, according to conventional methods, the overlay error $\Delta v1R=(\Delta x1R, \Delta y1R)$ between the standard measurement marks is measured and stored for the same image field points. In this case, the actual overlay error $\Delta v1R(real)$ results for each image field point as $\Delta v1R(real)=\Delta v1R+(\Delta vR-\Delta v1)$.

The orientation correction parameters are then determined according to known methods. This may be effected again, for example, in that for each gap exposed during a scanning operation on the wafer, the actual overlay error $\Delta v1R(real)$ is plotted against the location x on the image field. This is followed by the calculation of a compensation straight line for the x coordinate. This can be used to determine the scale and translation correction parameters in the x direction according to known methods. More precisely, these parameters are to be determined such that the maximum difference in the actual overlay error assumes a minimum over the respectively exposed gap.

These data are subsequently stored for later use, the correction values being processed and stored in an image-field-related manner.

After the correction has been carried out, a check is made to determine whether the correction method was successful by measuring the positional error and calculating the new overlay error according to the method described above.

When a precise overlay error determination for the measurement mark 3, 6 according to the invention is not possible due to problems during the overlay measurement at the measurement mark according to the invention owing to unfavorable substrate or due to other technological disturbances, by displacing the overlay measurement marks onto a layer stack having suitable reflection, the relative overlay error between the standard measurement mark and the measurement mark according to the invention can be determined.

By this measurement, the temporal stability of the pattern offset, more precisely the stability of the lens aberrations and of the imaging quality of the projection system, can furthermore be monitored and corrected in the event of disturbances determined, without relatively long time losses.

The method according to the invention can be simplified if previously determined relative positional errors of overlay-critical structures from upstream planes are stored in a matrix and can be used for the overlay error correction or for comparative assessments.

If more than one pattern geometry is critical in the plane to be patterned, for example, a number n of pattern geometries, then n different measurement marks or at least partial structures of measurement marks 3, 6 according to the invention have to be generated and measured with regard to the offset. A weighting of the different offsets then has to be performed for the calculation of the correction value to be used.

In practice, it may be too time-consuming and laborious to carry out the entire method described above for all wafers of a batch or for wafers of all batches. It is expedient in this case to determine the correction parameters only for one wafer of a batch and only to determine the offset for the rest of the wafers.

It may equally be expedient to check wafers of different batches at regular intervals to determine whether the parameters set are still valid, and to shorten the intervals if deviations are detected.

It further appears to be expedient to carry out the measurements of the positional deviation all at once for the entire image field. In this case, the following conditions must be fulfilled: the overlay error measurement system must have a sufficiently large receiving region; the software must permit a setting of the required number of "pattern edges" and be able to process and store the corresponding volume of data.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

REFERENCE SYMBOLS

1 First standard measurement mark (reference layer)
2 Second standard measurement mark (photoresist)
3 Micropatterned, first further measurement mark
3a y partial structure
3b x partial structure
4a Mask section for transferring the y partial structure
4b Mask section for transferring the x partial structure
5 Assist dummy structure
6 Micropatterned, second further measurement mark
7 Mask
8 Contact hole
9 Wafer
10 Image field
11 Chip
12 Light source
13 Beam path
14 Beam splitter
15 Objective
16 Wafer scanning
17 Illumination slot at the wafer
18 x-y table
19 CCD camera
20 Storage device
21 Processing device
22 Corner points of the image field
23 Central point of the image field
24a Circuit structure
24b Circuit pattern
25 Layer to be patterned, photoresist layer
26 Underlying reference layer

We claim:

1. A method for reducing an overlay error between structures of two photolithographic planes during the transfer of a respective circuit pattern by photo masks onto a semiconductor substrate in a projection system for fabricating integrated components, comprising:

a1) transferring a first standard measurement mark for determining the overlay error into a reference layer;

a2) transferring a second standard measurement mark assigned to the first standard measurement mark into a further layer on the semiconductor substrate;

a3) transferring at least one first further measurement mark assigned to the second standard measurement mark for determining an additional imaging error of the projection system into the further layer on the semiconductor substrate, the first further measurement mark having a geometry such that, during the transfer, the further measurement mark experiences the same lateral shift as one of the structures of a circuit pattern transferred into the further layer together with the first further measurement mark, b) measuring a first positional deviation between the mutually assigned standard measurement marks of the reference layer and the further layer;

c) measuring a second positional deviation between one of the standard measurement marks and the first further measurement mark;

d) calculating the overlay error from the measured first and the measured second positional deviation;

e) determining a correction value for an alignment of the semiconductor substrate during the transfer of the circuit pattern into the further layer; and f) transferring the circuit pattern onto the semiconductor substrate with application of the correction during the alignment.

2. The method as claimed in claim 1, wherein a second further measurement mark for determining the overlay error is transferred into the reference layer on the semiconductor substrate, the second further measurement mark having a geometry such that, during the transfer, the second further measurement mark experiencing the same lateral shift as one of the structures of a circuit pattern transferred into the reference layer together with the second further measurement mark.

3. The method as claimed in claim 1, wherein the second standard measurement mark and the first further measurement mark are transferred into a photoresist layer by exposure of an exposure field on the semiconductor substrate, wherein the first and the second positional deviation are measured in the photo resist layer.

4. The method as claimed in claim 1, wherein the second standard measurement mark and the first further measurement mark are transferred by exposure of an exposure field into a photoresist layer, and by etching, into the substrate or into a layer applied thereto, wherein the first and the second positional deviation are measured.

5. The method as claimed in claim 1, wherein a number of the first and second standard measurement marks and further measurement marks assigned thereto are distributed spaced apart from one another over an image field formed by the transfer on the semiconductor substrate, a correction value is determined, for the renewed transfer of the circuit pattern, the correction values of the measurement marks are used during the alignment.

6. The method as claimed in claim 1, wherein the first and second positional deviations are measured using light-optical means.

7. The method as claimed in claim 1, wherein the first and second positional deviations are measured using electron-optical means.

8. The method as claimed in claim 4, wherein a weighted average value is determined from the number of correction values.

9. The method as claimed in claim 1, wherein measurements of the positional deviations are repeated for a number of further measurement marks for determining the imaging error of the projection system, the further measurement marks having a geometry such that, during the transfer, the further measurement marks experience the same lateral shift as one of the structures of a further circuit pattern transferred into a respective other layer before or after the respective further measurement mark.

10. The method as claimed in claim 9, wherein the repeatedly measured positional deviations of the further measurement marks are stored in a matrix and are used for a further calculation of the overlay error with the structures of the further circuit patterns in the respective other layers.

11. The method as claimed in claim 1, wherein the first and second positional deviations are measured using a light-optical device.

12. The method as claimed in claim 1, wherein the first and second positional deviations are measured using an electron-optical device.

* * * * *